(12) United States Patent
Weiss et al.

(10) Patent No.: US 7,076,376 B1
(45) Date of Patent: Jul. 11, 2006

(54) SYSTEM AND METHOD FOR CALIBRATING WEAK WRITE TEST MODE (WWTM)

(75) Inventors: Donald R Weiss, Fort Collins, CO (US); Richard L. Woodruff, Fort Collins, CO (US); John J. Wuu, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/024,086

(22) Filed: Dec. 28, 2004

(51) Int. Cl.
*G11C 29/04* (2006.01)

(52) U.S. Cl. .................. 702/64; 702/107; 702/117; 365/201

(58) Field of Classification Search .................. 702/64, 702/58, 59, 80, 107, 117, 118, 124, 126, 189
See application file for complete search history.

(56) References Cited

U.S. PATENT DOCUMENTS

| | | | |
|---|---|---|---|
| 5,361,232 A | 11/1994 | Petschauer et al. | 365/201 |
| 5,428,574 A | 6/1995 | Kuo et al. | 365/201 |
| 5,566,110 A | 10/1996 | Soenen et al. | 365/185.07 |
| 5,835,429 A | 11/1998 | Schwarz | 365/201 |
| 6,002,623 A | 12/1999 | Stave et al. | 365/201 |
| 6,192,001 B1 | 2/2001 | Weiss et al. | 365/230.06 |
| 6,501,692 B1 | 12/2002 | Melanson et al. | 365/201 |
| 6,650,580 B1 * | 11/2003 | Braceras | 365/201 |
| 6,711,076 B1 | 3/2004 | Braceras | 365/201 |
| 6,829,183 B1 * | 12/2004 | Braceras | 365/201 |
| 2004/0004872 A1 * | 1/2004 | Templeton et al. | 365/201 |

OTHER PUBLICATIONS

Kwai, Ding-Ming et al., "Detection of SRAM cell stability by lowering array supply voltage", 9th Asian Test Symposium (ATS'00), Dec. 04-06, 2000, p. 268.
Yang, Josh et al., "Open Defects Detection within 6T SRAM Cells using a No Write Recovery Test Mode", Proceedings of the 17th Int'l Conf. on VLSI Design (VLSID'04), 2004, 6 pages, no month.
Renovell, M. et al., "Testing the Configurable Interconnect/Logic Interface of SRAM-Based FPGA's", 5 pages, no date.

* cited by examiner

*Primary Examiner*—Hal Wachsman

(57) ABSTRACT

According to at least one embodiment, a method comprises measuring drive current of a reference memory cell of a circuit, and determining, based on the measured drive current of the reference memory cell, a drive current to be supplied to a calibration memory cell of the circuit to mimic a defective memory cell. The method further comprises supplying the determined drive current to the calibration memory cell, and using the calibration memory cell to determine strength of a weak write to be utilized by a weak write test for detecting defective memory cells.

26 Claims, 3 Drawing Sheets

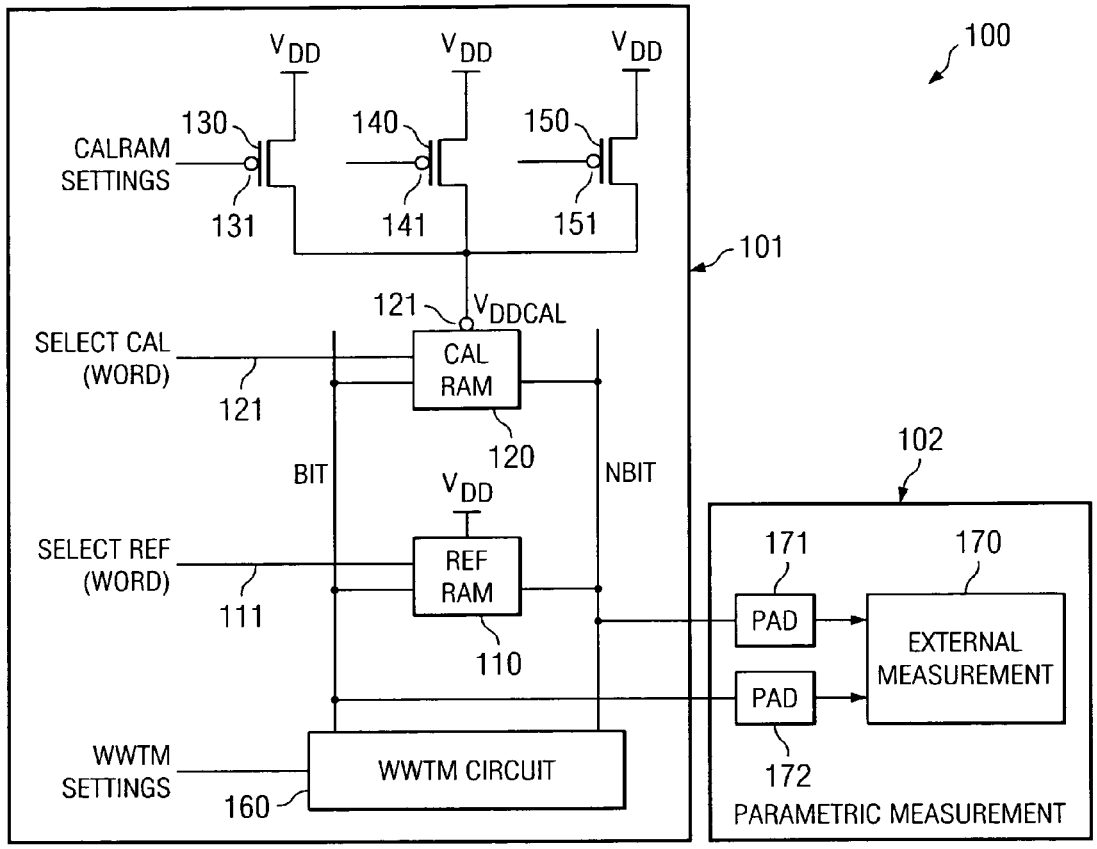

FIG. 1

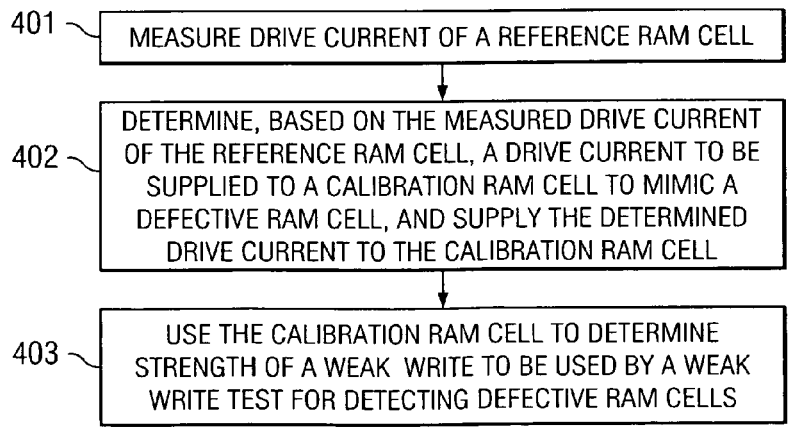

FIG. 4

401 — MEASURE DRIVE CURRENT OF A REFERENCE RAM CELL

402 — DETERMINE, BASED ON THE MEASURED DRIVE CURRENT OF THE REFERENCE RAM CELL, A DRIVE CURRENT TO BE SUPPLIED TO A CALIBRATION RAM CELL TO MIMIC A DEFECTIVE RAM CELL, AND SUPPLY THE DETERMINED DRIVE CURRENT TO THE CALIBRATION RAM CELL

403 — USE THE CALIBRATION RAM CELL TO DETERMINE STRENGTH OF A WEAK WRITE TO BE USED BY A WEAK WRITE TEST FOR DETECTING DEFECTIVE RAM CELLS

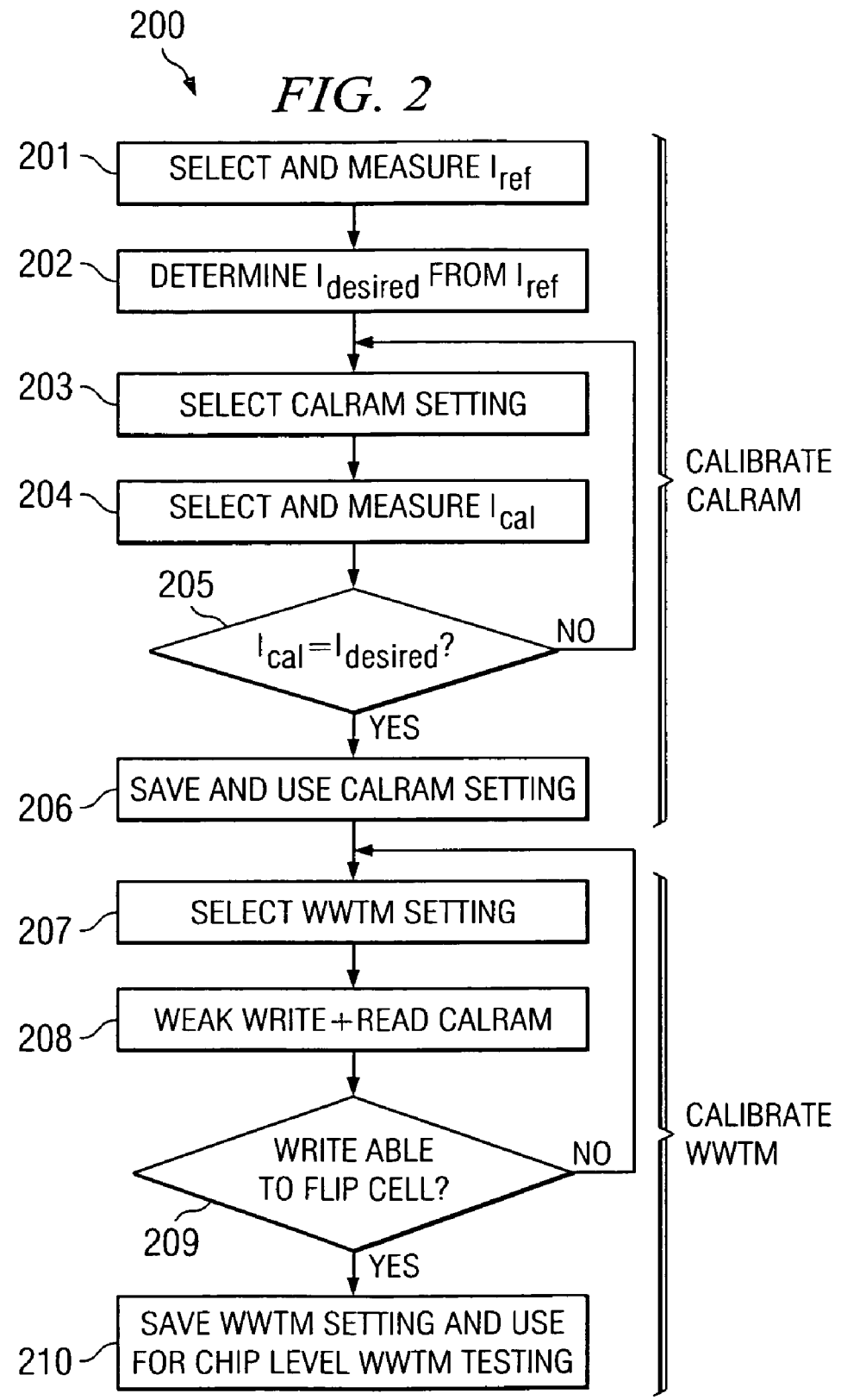

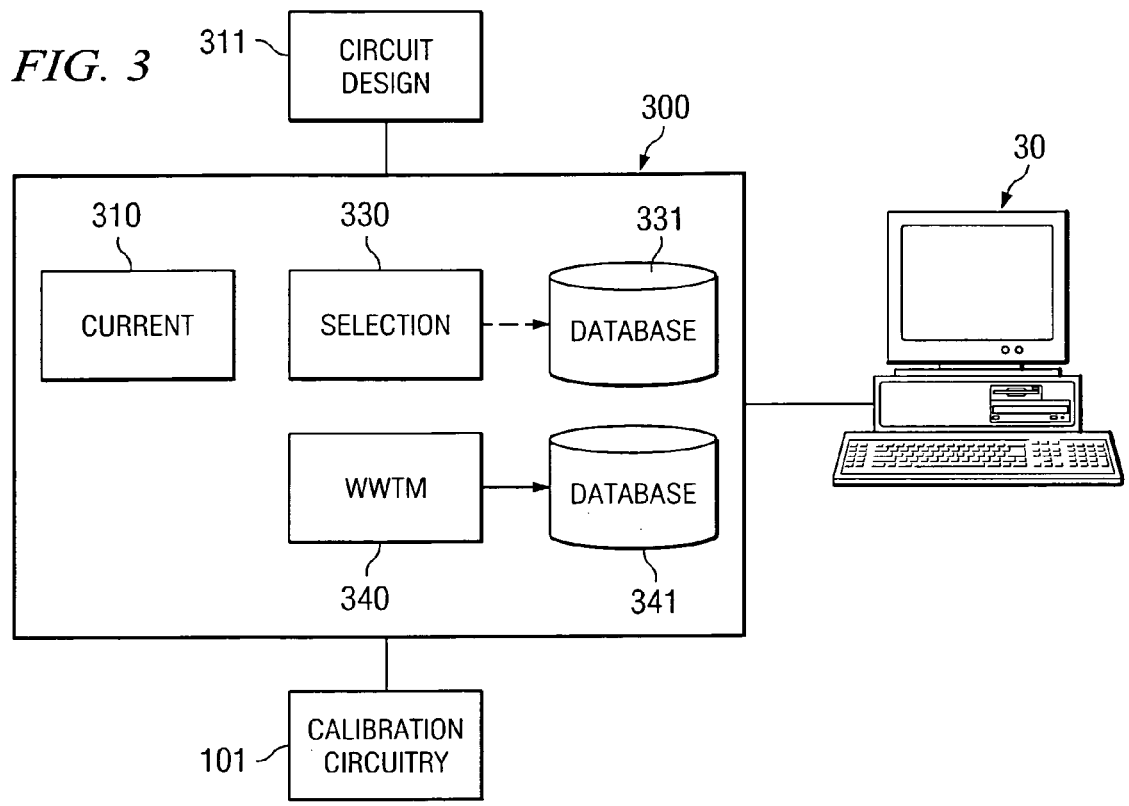
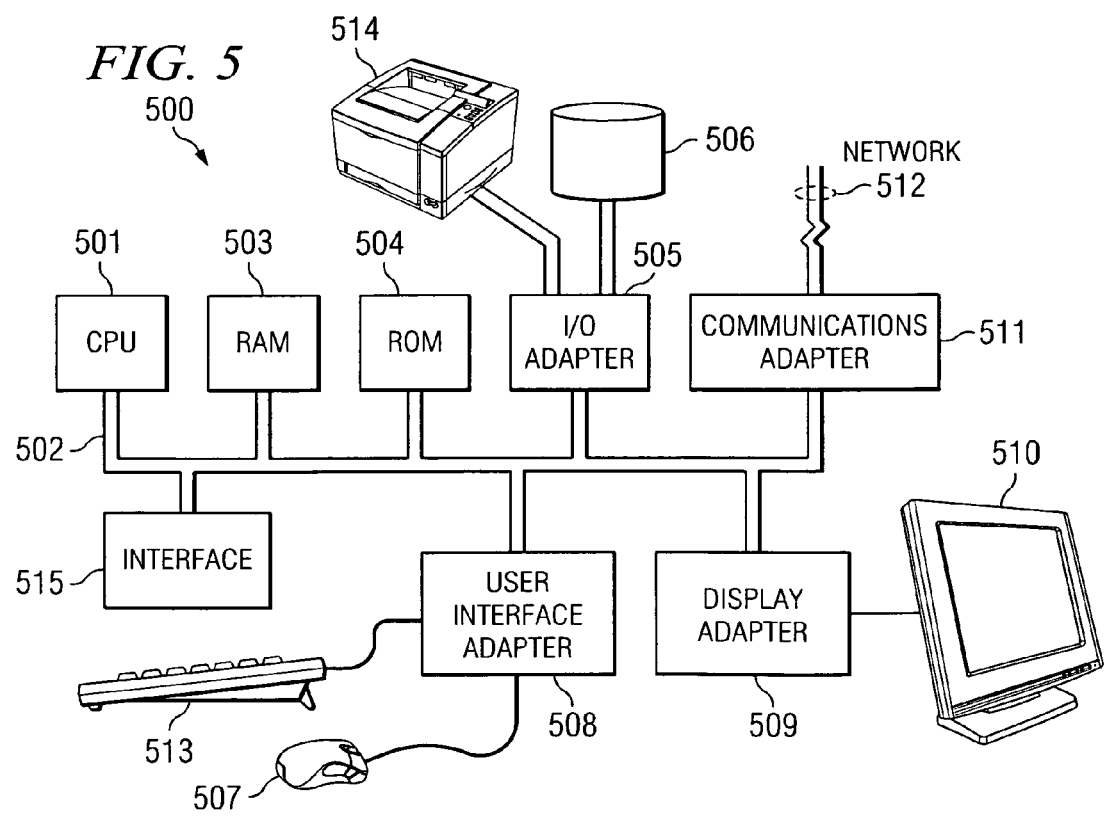

SYSTEM AND METHOD FOR CALIBRATING WEAK WRITE TEST MODE (WWTM)

FIELD OF THE INVENTION

This invention relates in general to memory and more particularly to a system and method for calibrating Weak Write Test Mode (WWTM).

DESCRIPTION OF RELATED ART

Static random access memory (SRAM) is a memory device that utilizes a storage vehicle which requires that only power remain on to retain data. Typically, it requires no refresh or synchronous timing edges, is easy to use, and can be an extremely fast memory device. SRAM devices usually include a plurality of SRAM cells that may store data using cross-coupled devices, such as inverters.

Manufacturing defects sometimes occur that can impair the functionality of SRAM cells. For example, a manufacturing defect may result in a missing connection to one of the PMOS-devices that are typically cross-connected in SRAM implementations. With a missing connection, the PMOS-devices may be too weak, and the SRAM cell may be unable to hold its data indefinitely. This type of fault in the defective cell may be referred to as a retention fault. Thus, some testing is needed to recognize the existence of the retention faults.

One such test method is known as Weak Write Test Mode ("WWTM"). A weak write test is active whereby a WWTM circuit actively attempts to weakly overwrite an SRAM cell. For example, suppose an SRAM cell comprises an inverter A and inverter B arranged back to back whereby the output of inverter A is normally a value of 1. By using WWTM, the SRAM cell may be overwritten so that the output of inverter A is now flipped down to a value of 0. This overwriting of the SRAM cell is only possible in a cell that is unstable due to the presence of a defect. If the cell can be weakly overwritten, it is assessed to be defective, and if it cannot be weakly overwritten, it is deemed healthy. However, a key aspect of the WWTM testing method is to determine the threshold strength of the WWTM circuit to use for testing. For example, it is desirable to determine the threshold strength of the WWTM circuit for determining when an SRAM cell is good enough to be declared a healthy cell. If the WWTM circuit strength is set too strong, there is high probability that good parts will be thrown away, and if the WWTM circuit strength is set too weak, there is a high probability that some bad parts will be passed on as good parts.

Due to the difficulty in identifying the appropriate WWTM circuit strength in a pre-silicon environment, a Programmable Weak Write Test Mode (PWWTM) may be used in order to allow different WWTM circuit strengths to be selected in silicon testing. Thus, with the use of PWWTM, the strength of the WWTM circuit can be tuned to the appropriate strength. However, it is still very difficult to determine appropriate thresholds for determining which cells are good and which cells are bad. Thus, methods currently used in calibrating the WWTM strength in the process of testing cells involves a process of measuring the normal drive current of a cell, such as measuring the p-channel field effect transistor (PFET) drive current. After the current is measured, a focused ion beam (FIB) is used to intentionally damage a PFET in an SRAM cell in order to reduce its drive current to a certain percentage of its normal drive current. After the cell is damaged, a PWWTM testing method may be used to identify the WWTM circuitry settings at which the damaged cell barely fails the WWTM tests. However, the use of the FIB to properly calibrate the WWTM circuitry (i.e., the appropriate test threshold) is very expensive, difficult, and time consuming. Accordingly, what is needed is an improved scheme for adjusting or calibrating settings of WWTM.

BRIEF SUMMARY OF THE INVENTION

According to at least one embodiment, a method of calibrating a Weak Write Test Mode (WWTM) comprises measuring a drive current of a reference random access memory (RAM) cell. The method further comprises determining, based on the measured drive current of the reference RAM cell, a drive current to supply to a calibration RAM cell for mimicking a defective RAM cell, and using the calibration RAM cell to determine strength of a weak write for a WWTM test circuit to utilize for detecting defective RAM cells.

According to at least one embodiment, a system for calibrating a WWTM testing process comprises means for measuring drive current of a reference memory cell, and means for determining, based at least in part on the measured drive current of the reference memory cell, a drive current for a calibration memory cell to mimic a defective memory cell. The system further comprises means for selectively adapting drive current of the calibration memory cell to be the determined drive current for mimicking a defective memory cell, and means for determining, based on the calibration memory cell having the determined drive current for mimicking a defective memory cell, a weak write strength for a WWTM circuit to utilize for detecting defective memory cells.

According to at least one embodiment, a computer program product having a computer readable medium having computer program logic recorded thereon for calibrating the strength of a weak write to be used by a weak write test for detecting defective memory cells in a circuit is provided. The computer program product comprises code for determining, based at least in part on a measured drive current of a reference memory cell of a circuit, a drive current for a calibration memory cell of the circuit to mimic a defective memory cell. The computer program product further comprises code for generating control signals to selectively adapt the calibration memory cell's drive current to the determined drive current for mimicking a defective memory cell, and code for determining, based on the calibration memory cell having the adapted drive current for mimicking a defective memory cell, strength of a weak write to be utilized by a weak write test circuit for detecting defective memory cells in the circuit.

According to at least one embodiment, a method comprises measuring drive current of a reference memory cell of a circuit, and determining, based on the measured drive current of the reference memory cell, a drive current to be supplied to a calibration memory cell of the circuit to mimic a defective memory cell. The method further comprises supplying the determined drive current to the calibration memory cell, and using the calibration memory cell to determine strength of a weak write to be utilized by a weak write test for detecting defective memory cells.

BRIEF DESCRIPTION OF DRAWINGS

FIG. 1 depicts a circuit utilized in calibrating WWTM, according to one embodiment;

FIG. 2 is flowchart illustrating steps executed for calibrating WWTM, according to one embodiment;

FIG. 3 is an illustration of a general architecture of a system of one embodiment for calibrating WWTM;

FIG. 4 shows a generic operational flow diagram according to certain embodiments provided herein for calibrating strength of a weak write to be used by a weak write test for detecting defective memory cells; and FIG. 5 depicts a block diagram of a computer system which is adapted to use an embodiment for calibrating WWTM.

DETAILED DESCRIPTION

FIG. 1 illustrates a test circuit 100 for calibrating the WWTM settings, such as calibrating or adjusting the strength of the WWTM circuit, according to one embodiment. Exemplary test circuit 100 includes a calibration portion 101 that is implemented on a chip. Such chip may further include additional circuitry, such as various RAM cells (not shown) implemented thereon. Calibration portion 101 includes at least one reference RAM cell 110, a calibration RAM cell 120, and WWTM circuit 160. As described further herein, the reference calibration RAM cell 120 is used to mimic a defective RAM cell. That is, a drive current that mimics that of a defective RAM cell is provided to the calibration RAM cell 120 by the PFETs 130, 140, and 150. Such drive current of the calibration RAM cell 120 is determined based on the measured drive current of the reference RAM cell 110. Then, the calibration RAM cell 120 is used to calibrate the WWTM circuit 160. That is, the strength of a weak write to be used in a WWTM in order to properly detect defective RAM cells is determined based on the calibration RAM 120. The determined strength of the WWTM 160 that is proper for testing for defective RAM cells may then be used by WWTM circuitry for testing the actual RAM cells (not shown) of the chip. Thus, according to certain embodiments, the calibration portion 101 of a chip is used to calibrate the WWTM strength for such chip, and the determined WWTM strength is then used for testing the actual RAM cells of the chip. Because, in this embodiment, the calibration of the drive strength of calibration RAM cell 120 and thus in turn the calibration of the strength of the WWTM 160 is based on an actual reference RAM cell 110 of the chip, the WWTM can be precisely calibrated for such chip.

In the example of FIG. 1, calibration portion 101 includes calibration RAM cell (e.g., SRAM cell) 120 that includes VDD port 121. Calibration portion 101 also includes a plurality of transistors 130, 140, and 150. Transistors 130, 140, and 150 can be implemented as PFETs, N-channel field effect transistors (NFETs), or any combination of PFETs and NFETs. As shown in this example, transistors 130, 140, and 150 are depicted as PFETs that include selectors 131, 141, and 151, respectively. Accordingly, as opposed to traditional SRAM cells, VDD port 121 of calibration RAM cell 120 is not connected to its true supply voltage but is gated with additional transistors 130, 140, and 150. By gating VDD port 121 with the transistors, an extra resistance path is created between the real supply voltage and the RAM cell's supply voltage. In the specific example of FIG. 1, the transistors, 130, 140, and 150 are arranged in parallel, and any number of different on/off combinations of transistors 130, 140, and 150 can be chosen to simulate different resistance values through the transistors. That is, selectors 131, 141, and 151 can be used to selectively turn the respective transistors on or off during testing in order to achieve a desired drive current supplied to calibration RAM 120. For example, selectors 131, 141, and 151 may be toggled through scan chain, machine specific register (MSR) settings, and the like, until a desired drive current that mimics that of a defective RAM cell is provided to calibration RAM 120. Of course, although the exemplary calibration portion 101 is illustrated with three transistors 130, 140, and 150, calibration circuit 101 is not limited to this configuration, as it may be implemented in other configurations to include more or less than three transistors.

The inputs to selectors 131, 141, and 151 are referred to as the calibration RAM settings, and as described above those settings dictate the drive current of the calibration RAM cell 120 and can be set to cause the calibration RAM cell 120 to mimic a defective RAM cell. The drive current that is selected for the calibration RAM cell 120 to mimic a defective RAM cell is selected, according to this embodiment, based on reference RAM cell 110. That is, calibration portion 101 includes reference RAM cell 110, which is supplied VDD, just as the actual RAM cells of the chip. Reference RAM cell 110 can be accessed (e.g., written to or read from) by activating select reference line 111, which is effectively a WORD line for reference RAM 110. The BIT and NBIT lines shown are the data signal lines used to read or write the reference RAM cell(s) 110 and calibration RAM cell(s) 120 when the corresponding WORD line is asserted. They may be driven strongly via the external pads or on-chip write circuitry to initialize the reference and calibration RAM cells to the state required for each step in the calibration process. These signals are also used to connect to the parametric measurement logic 102 to directly or indirectly measure the drive strength of the reference and calibration RAM cells. There is a high probability that the reference RAM cell 110 is a good cell because there are generally not many defective RAM cells that are produced by the fabrication process. Further, in certain implementations, a plurality of reference RAM cells 110 may be included and all of such reference RAM cells may be used in determining the drive current of a good RAM cell.

In this example embodiment, the drive current of reference RAM cell 110 is measured. That is, parametric measurement logic 102 is utilized to measure the drive current of reference RAM cell 110. Such parametric measurement logic 102 may be on-chip measurement circuitry in certain implementations, or it may be external (off-chip) measurement circuitry in other implementations. In the illustrative example shown in FIG. 1, parametric measurement logic 102 includes external measurement circuitry 170, which measures the drive current of reference RAM cell 110 via pads 171 and 172. Any suitable circuitry (on-chip or off-chip) for measuring the drive current of the reference RAM cell 110 may be utilized.

The measured drive current of reference RAM cell 110 provides a baseline drive current for the good RAM cells of the chip. Once such baseline drive current is known, the drive current of a defective RAM cell can be accurately determined. That is, some algorithm may be used to compute, from the known baseline drive current, the likely (or worst-case) drive current of a defective RAM cell. Because the baseline drive current is measured for an actual reference RAM cell 110 (as opposed to simply derived through simulations, etc.), the drive current of a defective RAM cell can be accurately computed for this chip.

Once the drive current for a defective RAM cell is computed (based on the measured drive current of the reference RAM cell 110), the calibration RAM settings are adjusted to turn on the appropriate combination of PFETs 130, 140, 150 in order to achieve the computed drive current for calibration RAM cell 120 so that calibration RAM 120 mimics a defective RAM cell. Then, WWTM circuit 160 is calibrated based on the calibration RAM cell 120. For instance, WWTM 160 may attempt to flip the bit stored to the calibration RAM cell 120 with progressively stronger weak writes until a weak write is determined to be sufficiently strong that it successfully flips the bit (e.g., from a 0 to a 1 or vice-versa). Select calibration line 121 is effectively a WORD line for calibration RAM 120, which can be activated to enable access of calibration RAM 120. Thus, WWTM circuit 160 calibrates the strength of its weak write to be used in the weak write testing of the actual RAM cells (not shown) of the chip based on the calibration RAM 120, which has a drive current that mimics that of a defective RAM cell (which was determined based on the measured drive current of the reference RAM cell 110).

While PWWTM testing provides the ability to quickly change the strength of the WWTM circuitry, it has traditionally been very difficult to calibrate WWTM testing and determine exactly which strength settings to use for a weak write test in order to effectively and accurately cause the unhealthy cells to fail and the healthy cells to pass. That is, while the PWWTM circuitry allows the strength of the weak write to be dynamically programmed, the value to which such strength should be programmed for accurately detecting defective cells has traditionally been difficult to determine. Embodiments provided herein enable the appropriate strength of a weak write that is to be used by a weak write test for accurately detecting defective cells of a chip to be determined with great precision. It should be recognized that the embodiments provided herein, such as the example of FIG. 1, enable great precision in calibrating the WWTM circuitry because it bases such calibration on measurements made on-chip (e.g., with reference RAM cell 110 and calibration RAM cell 120), rather than making such calibration determinations through simulations or expected values for a given chipset. Accordingly, the WWTM calibration can be performed for each chip (e.g., each die) or for each wafer, etc., and the specific characteristics of the actual chip (in silicon) are accounted for in arriving at the calibrated value of the strength of a weak write to be used by the WWTM circuitry for the corresponding chip (or chips of the corresponding wafer).

FIG. 2 depicts a flowchart illustrating an exemplary operational flow 200 for calibrating WWTM settings according to one embodiment, such as that of FIG. 1. The exemplary operational flow 200 has two operational parts. The first part shown includes operations (blocks 201–206) for calibrating the drive current of the calibration RAM cell such that it mimics a defective cell. The second part shown includes operations (blocks 207–210) for calibrating the strength of the weak write to be used by the WWTM circuitry for detecting defective RAM cells. The specific operations of this exemplary operational flow 200 are described further below.

In operational block 201, a reference (or "baseline") drive current, $I_{ref}$, is selected (e.g., via select reference line 111 of FIG. 1) and measured. For instance, in the exemplary embodiment of FIG. 1, parametric measurement logic 102 measures the drive current of reference RAM cell 110. This provides the drive current (i.e., $I_{ref}$) of good RAM cells of the chip(s) under analysis. Preferably, the measured drive current $I_{ref}$ is the drive current of PFETs located in the reference memory cell. However, in alternative embodiments, the NFET drive current of a cell may be measured.

In operational block 202, a desired drive current, $I_{desired}$, that mimics a defective RAM cell is determined based on the measured $I_{ref}$. For example, an algorithm may be used that determines $I_{desired}$ in relation to the measured $I_{ref}$ (e.g., as some percentage of $I_{ref}$). Any technique that computes the drive current $I_{desired}$ based at least in part on the measured $I_{ref}$ value may be utilized, and the technique (e.g., algorithm) utilized may vary from chipset to chipset.

In operational block 203, a calibration RAM setting is selected in attempt to provide a drive current of the computed $I_{desired}$ to a calibration RAM cell. For instance, in the exemplary embodiment of FIG. 1, a combination of PFETs 130, 140, and 150 is activated to supply a drive current of $I_{desired}$ to calibration RAM cell 120 in attempt to cause the calibration RAM cell 120 to mimic a defective cell. That is, activation of a combination of PFETs 130, 140, and 150 adds additional resistance through the PFET path of the calibration RAM cell 120, which results in an artificial defect being added to this memory cell.

In operational block 204, the drive current of the calibration RAM cell is selected and measured. The measured drive current of the calibration RAM cell is referred to as $I_{cal}$. With reference to the exemplary embodiment of FIG. 1, the drive current of calibration RAM cell 120 of FIG. 1 may be selected via select calibration line 121 and such drive current may be measured by parametric measurement logic 102.

In operational block 205, a determination is made whether the measured drive current of the calibration RAM cell, $I_{cal}$, equals (or is sufficiently close to) $I_{desired}$. If not, operation returns to block 203 whereat new calibration RAM settings are selected (e.g., a new combination of PFETs 130, 140, and 150 is activated in attempt to achieve the desired drive current that mimics a defective RAM cell). The selection of combinations of the PFETs to activate may be implemented, for example, through various processes, such as serial scan path, machine specific register (MSR) settings, and the like. Once determined in block 205 that the measured current of the calibration RAM cell, $I_{cal}$, equals (or is sufficiently close to) $I_{desired}$, operation continues to block 206 whereat the calibration RAM settings (e.g., the combination of PFETs 130, 140, and 150 to be activated for mimicking a defective RAM cell) are saved for use in calibrating the WWTM, as described below.

In operational block 207, a WWTM setting is selected. That is, an initial strength of a weak write to be used in attempt to flip the bit of the calibration RAM cell is selected. In certain embodiments, this initial strength is selected to be very weak, and such strength is progressively increased until an appropriate strength for detecting a defective cell (e.g., a minimum strength that causes the calibration RAM cell's bit to flip) is determined.

In operational block 208, the WWTM circuitry (e.g., WWTM 160 of FIG. 1) attempts a weak write (using the selected strength of block 207) to try to flip the bit of the calibration RAM cell (e.g., from a 0 to a 1 or vice-versa), and then the WWTM circuitry reads the calibration RAM cell. In block 209, a determination is made whether the weak write attempted by the WWTM circuitry in block 208 was successful in its attempt to flip the bit of the calibration RAM cell. If the weak write of the WWTM circuitry was not able to flip the bit of the calibration RAM cell, then operation returns to block 207 whereat a new, stronger setting for the weak write is selected. Otherwise, operation advances to block 210 whereat the WWTM setting (e.g., strength of the weak write) is saved for use in testing the actual RAM cells of the chip. This saved WWTM setting may be used in the testing of various RAM arrays of the chip. For example, in microprocessor design there are generally many different SRAM arrays, and each specific implementation may use different SRAM cells, different column selects, and the like. Thus, the testing of the different implementations may be done with different WWTM circuits whereby the different WWTM circuits may have to be individually calibrated. Yet, once the WWTM circuit is calibrated in the above manner for a specific implementation, that WWTM circuit setting may be used to test all arrays that employ such implementation. In this manner, a considerable amount of time is saved as the time spent on calibrating WWTM circuit settings is reduced, and the accuracy of the calibration of the WWTM for the specific chip is enhanced.

While flow 200 may be used for calibrating a WWTM for testing an SRAM cell, flow 200 may likewise be implemented for any type of chip for WWTM calibration as opposed to only chips that survive a focused ion beam (FIB) process and that achieve the correct drive current. In one embodiment, flow 200 maybe implemented with the use of a scanning chain that provides a way to serially shift or scan values into or out of latches on a chip for setting the drive current of the calibration RAM cell and/or for setting the strength of the weak write used by the WWTM circuitry. With the use of a scanning chain, old data values can also be overwritten by scanning in a new data value. In another embodiment, various portions of flow 200, such as operational block 202, may be implemented through a software algorithm.

FIG. 3 is a diagram illustrating an exemplary WWTM calibration environment 300 according to one embodiment. In this example, WWTM calibration environment 300 represents an application running on computer 30. Of course, in other embodiments, the various functional operations described herein may be distributed across a plurality of applications executing on computer 30. In addition to WWTM calibration environment 300, computer 30 may include an operating system, a computer's coordinating program that is built on the instruction set for a processor or a microprocessor, and the hardware that performs the logic operations and manages the data movement of the computer. Thus, the exemplary WWTM calibration environment 300 may be implemented on an external test system (e.g., computer 30). In other embodiments, all or a portion of the WWTM calibration environment may be implemented locally on the chip that is under analysis.

As described further herein, calibration circuitry 101 (such as the exemplary circuitry 101 of FIG. 1) that is implemented on a chip (or wafer) that is under analysis is included. Computer 30 receives measurements from and outputs data to control settings (e.g., calibration RAM settings and/or WWTM circuitry settings) on such calibration circuitry 101. WWTM calibration environment 300 executes on computer 30 to use the received measurements and control the output data in order to calibrate the WWTM circuitry for a chip under analysis.

In this exemplary embodiment, WWTM calibration environment 300 includes current detection module 310, selection module 330, and WWTM module 340. As with the exemplary embodiments described above, WWTM calibration environment 300 is advantageous, for example, as it may function to determine the appropriate weak write strength to be used by a WWTM circuit without the need to use a focused ion beam. Current detection module 310 is operable to measure current flowing in a RAM cell. For example, current detection module 310 may analyze an SRAM cell in order to measure the PFET drive current through the PFETs of an SRAM cell. Such measurements may be performed for a reference RAM cell (as in operational block 201 of FIG. 2) and for a calibration RAM cell (as in operational block 204 of FIG. 2). Circuit design module 311 may include circuit simulation or analysis used to model defects and determine the change in electrical behavior of the reference or calibration RAM cells, such as drive strength. In particular, it can be used to establish Idesired.

Selection module 330 is operable to alter the calibration RAM settings of calibration circuitry 101 in order to provide a drive current to a calibration RAM cell that mimics that of a defective RAM cell, such as in operational blocks 202–206 of FIG. 2. For example, selection module 330 may determine, from the measured drive current of a reference cell (measured by current module 310), a desired drive current that mimics a defective RAM cell. And, selection module 330 may set the calibration RAM settings to selectively cause a combination of PFETs (e.g., PFETs 130, 140, and 150 of FIG. 1) to be turned on in attempt to achieve the desired drive current in the calibration RAM cell. As discussed with operational block 204 of FIG. 2, selection module 330 may utilize current module 310 to measure the drive current of the calibration RAM cell to ensure that the desired drive current is achieved for mimicking a defective RAM cell. Once the desired drive current is ensured to be achieved, the calibration RAM settings (e.g., the combination of PFETS 130, 140, and 150 that are turned on) that yielded the desired drive current in the calibration RAM cell may be stored to a database, such as database 331, for later use. Database 331 may also be connected to an external network so that teams or individuals that are remotely located from database 331 may access the proper calibration RAM settings and utilize such data for their own testing needs.

WWTM module 340 selects WWTM settings and evaluates the use of such settings by the WWTM circuitry in attempting to perform a weak write to the calibration RAM cell (to determine whether the strength of the weak write is sufficiently strong to flip the bit of the calibration RAM cell), as in the operations of blocks 207–210 of FIG. 2. In one embodiment, WWTM module 340 may input data to calibration circuitry 101 to program a PWWTM (e.g., WWTM circuitry 160 of FIG. 1) in order to evaluate various weak write strengths that may be used by the PWWTM circuit. Such weak write strengths may be evaluated to determine the strength that will just barely cause the calibration RAM cell that is mimicking a defective cell to fail (i.e., have its bit flipped with a weak write). Once the proper strength of the weak write to be used by the WWTM circuit has been determined, the strength value may be stored to a database, such as database 341, for later use. Database 341 may also be connected to an external network so that teams or individuals that are remotely located from database 341 may access the proper weak write strengths for the chip under analysis and utilize such data for their own testing needs.

In alternative embodiments, WWTM calibration environment 300 may be configured to include more or less modules than modules 310, 330, and 340 of FIG. 3. In addition, the various modules may be combined in certain embodiments to make up each of the modules 310, 330, and 340, and/or some or all of the various modules 310, 330, and 340 may be integrated into a common module in some embodiments.

When WWTM calibration environment 300 is implemented in software, the elements of the embodiments are essentially the code segments to perform the necessary tasks. The program or code segments can be stored in a processor-readable medium or transmitted by a computer data signal embodied in a carrier wave, or a signal modulated by a carrier, over a transmission medium. The "processor-readable medium" or "computer-readable medium" may include any medium that can store and/or transfer information. Examples of the processor (or "computer") readable medium include, without limitation, an electronic circuit, a semiconductor memory device, a ROM, a flash memory, an erasable ROM (EROM), a random access memory (RAM), a floppy diskette, a compact disk CD-ROM, an optical disk, a hard disk, a fiber optic medium, a radio frequency (RF) link, et cetera. The computer data signal may include any signal that can propagate over a transmission medium such as electronic network channels, optical fibers, air, electromagnetic, RF links, et cetera. The code segments may be downloaded via computer networks such as the Internet, Intranet, WAN, LAN, et cetera.

While specific exemplary calibration techniques are described in FIGS. 2 and 3 above, FIG. 4 shows a generic flow diagram according to certain embodiments hereof for calibrating a WWTM. In operational block 401, drive current of a reference RAM cell is measured. In operational block 402, based on the measured drive current of the reference RAM cell, a drive current to be supplied to a calibration RAM cell to mimic a defective RAM cell is determined and supplied to such calibration RAM cell. In operational block 403, the calibration RAM (that mimics a defective RAM cell) is used to determine strength of a weak write to be utilized by a weak write test for detecting defective RAM cells.

Calibration test circuit 101 may be implemented in a variety of ways on silicon. In an embodiment, one or more reference RAM cells and one or more calibration RAM cells are connected on the same BIT and NBIT signal lines along with the WWTM circuit. The control signals (CALRAM settings, WORD lines, and WWTM settings) are implemented using scan based or parallel control circuit design techniques. In an embodiment, calibration test circuit 101 is implemented on each die so that it's circuit operation more closely matches the operation of each die. However, it may be implemented or tested on only one location on the wafer or only one wafer in the production lot as determined by the required measurement accuracy.

FIG. 5 illustrates computer system 500 adapted to use embodiments for calibrating WWTM operations, such as computer 30 of FIG. 3, e.g. storing and/or executing software associated with the embodiments. Interface 515 is included to enable computer system 500 to communicatively interface with test circuit 100, e.g., interface with calibration portion 101 and/or parametric measurement logic 102. Central processing unit (CPU) 501 is coupled to system bus 502. The CPU 501 may be any general purpose CPU. Embodiments described herein are not restricted by the architecture of CPU 501 as long as CPU 401 supports the inventive operations as described herein. Bus 502 is coupled to random access memory (RAM) 503, which may be SRAM, DRAM, or SDRAM. ROM 504 is also coupled to bus 502, which may be PROM, EPROM, or EEPROM. RAM 503 and ROM 504 hold user and system data and programs as is well known in the art.

Bus 502 is also coupled to input/output (I/O) controller card 505, communications adapter card 511, user interface card 508, and display card 509. The I/O adapter card 505 connects storage devices 506, such as one or more of a hard drive, a CD drive, a floppy disk drive, a tape drive, to computer system 500. The I/O adapter 505 is also connected to printer 514, which would allow the system to print paper copies of information, such as an output of a repaired circuit design, documents, photographs, articles, et cetera. Note that the printer may be a printer (e.g. dot matrix, laser, et cetera.), a fax machine, scanner, or a copier machine. Communications card 511 is adapted to couple the computer system 500 to a network 512, which may be one or more of a telephone network, a local (LAN) and/or a wide-area (WAN) network, an Ethernet network, and/or the Internet network. User interface card 508 couples user input devices, such as keyboard 513, pointing device 507, et cetera to the computer system 500 to receive various inputs. The display card 509 is driven by CPU 501 to control the display on display device 510.

What is claimed is:

1. A method of calibrating a Weak Write Test Mode (WWTM) comprising:
    measuring a drive current of a reference random access memory (RAM) cell;
    determining, based on the measured drive current of the reference RAM cell, a drive current to supply to a calibration RAM cell for mimicking a defective RAM cell; and
    using said calibration RAM cell to determine strength of a weak write for a WWTM test circuit to utilize for detecting defective RAM cells.

2. The method of claim 1 wherein said measuring step comprises measuring drive current of at least one p-channel field effect transistor (PFET) of the reference RAM cell.

3. The method of claim 1 wherein said determining said drive current to supply to a calibration RAM cell for mimicking a defective RAM cell comprises:
    determining said drive current as a function of said measured drive current of said reference RAM cell.

4. The method of claim 1 wherein said determining said drive current to supply to a calibration RAM cell for mimicking a defective RAM cell comprises:
    determining said drive current as a percentage of said measured drive current of said reference RAM cell.

5. The method of claim 1 wherein said determining said drive current to supply to a calibration RAM cell for mimicking a defective RAM cell comprises:
    determining said drive current according to a predetermined algorithm.

6. The method of claim 1 further comprising:
    selectively turning on one or more transistors coupled to said calibration RAM cell to supply said determined drive current to said calibration RAM cell so that the calibration RAM cell mimics a defective RAM cell.

7. The method of claim 6 further comprising:
    measuring drive current of said calibration RAM cell after said selectively turning on said one or more transistors; and
    analyzing said measured drive current of said calibration RAM cell to determine if said measured drive current of said calibration RAM cell matches the determined drive current for mimicking a defective RAM cell.

8. The method of claim 7 further comprising:
    if determined that said measured drive current of said calibration RAM cell does not match the determined drive current for mimicking a defective RAM cell, selecting a different combination of said one or more transistors to turn on.

9. The method of claim 7 further comprising:
    if determined that said measured drive current of said calibration RAM cell matches the determined drive current for mimicking a defective RAM cell, storing information identifying the selected ones of said one or more transistors to turn on for providing said determined drive current to the calibration RAM cell.

10. The method of claim 1 wherein said reference RAM cell is a static RAM (SRAM) cell.

11. The method of claim 1 wherein said using said calibration RAM cell to determine strength of a weak write for a WWTM test circuit to utilize for detecting defective RAM cells comprises:
   attempting, with a plurality of different weak write strengths, to flip a bit of said calibration RAM cell having said determined drive current for mimicking a defective cell; and
   determining which of said plurality of different weak write strengths was able to flip said bit of said calibration RAM cell.

12. The method of claim 11 further comprising:
   determining a minimum strength of said plurality of different weak write strengths that was able to flip said bit of said calibration RAM cell; and
   selecting said minimum strength as said strength for said WWTM test circuit to utilize for detecting defective RAM cells.

13. A system for calibrating a WWTM testing process comprising:
   means for measuring drive current of a reference memory cell;
   means for determining, based at least in part on the measured drive current of the reference memory cell, a drive current for a calibration memory cell to mimic a defective memory cell;
   means for selectively adapting drive current of the calibration memory cell to be the determined drive current for mimicking a defective memory cell; and
   means for determining, based on the calibration memory cell having the determined drive current for mimicking a defective memory cell, a weak write strength for a WWTM circuit to utilize for detecting defective memory cells.

14. The system of claim 13 wherein said means for determining the drive current for a calibration memory cell to mimic a defective memory cell comprises:
   means for determining the drive current for the calibration memory cell as a function of the measured drive current of the reference memory cell.

15. The system of claim 13 wherein said means for selectively adapting the drive current of the calibration memory cell comprises:
   a plurality of transistors coupled to said calibration memory cell, wherein any combination of said plurality of transistors can be selectively activated to adapt the drive current of said calibration memory cell.

16. The system of claim 13 wherein said means for determining a weak write strength for a WWTM circuit comprises:
   means for attempting, with a plurality of different weak write strengths, to flip a bit of said calibration memory cell having said determined drive current for mimicking a defective memory cell; and
   means for determining which of said plurality of different weak write strengths was able to flip said bit of said calibration memory cell.

17. The system of claim 16 wherein said means for determining a weak write strength for a WWTM circuit further comprises:
   means for determining a minimum strength of said plurality of different weak write strengths that was able to flip said bit of said calibration memory cell; and
   means for selecting said minimum strength as said weak write strength for said WWTM test circuit to utilize for detecting defective memory cells.

18. A computer program product having a computer readable medium having computer program logic recorded thereon for calibrating the strength of a weak write to be used by a weak write test for detecting defective memory cells in a circuit, the computer program product comprising:
   code for determining, based at least in part on a measured drive current of a reference memory cell of a circuit, a drive current for a calibration memory cell of the circuit to mimic a defective memory cell;
   code for generating control signals to selectively adapt the calibration memory cell's drive current to the determined drive current for mimicking a defective memory cell; and
   code for determining, based on the calibration memory cell having the adapted drive current for mimicking a defective memory cell, strength of a weak write to be utilized by a weak write test circuit for detecting defective memory cells in the circuit.

19. The computer program product of claim 18 further comprising:
   code for measuring drive current of the reference memory cell.

20. A method comprising:
   measuring drive current of a reference memory cell of a circuit;
   determining, based on the measured drive current of the reference memory cell, a drive current to be supplied to a calibration memory cell of the circuit to mimic a defective memory cell;
   supplying the determined drive current to the calibration memory cell; and
   using the calibration memory cell to determine strength of a weak write to be utilized by a weak write test for detecting defective memory cells.

21. The method of claim 20 wherein said supplying the determined drive current to the calibration memory cell further comprises:
   selectively turning on one or more transistors coupled to said calibration memory cell to supply said determined drive current to said calibration memory cell so that the calibration memory cell mimics a defective memory cell.

22. The method of claim 21 further comprising:
   measuring drive current of said calibration memory cell after said selectively turning on said one or more transistors; and
   analyzing said measured drive current of said calibration memory cell to determine if said measured drive current of said calibration memory cell matches the determined drive current for mimicking a defective memory cell.

23. The method of claim 22 further comprising:
   if determined that said measured drive current of said calibration memory cell does not match the determined drive current for mimicking a defective memory cell, selecting a different combination of said one or more transistors to turn on.

24. The method of claim 22 further comprising:
   if determined that said measured drive current of said calibration memory cell matches the determined drive current for mimicking a defective memory cell, storing information identifying the selected ones of said one or more transistors to turn on for providing said determined drive current to the calibration memory cell.

25. The method of claim 20 wherein said using the calibration memory cell to determine strength of a weak write to be utilized by a weak write test for detecting defective memory cells comprises:
   attempting, with a plurality of different weak write strengths, to flip a bit of said calibration memory cell having said determined drive current for mimicking a defective memory cell; and determining which of said plurality of different weak write strengths was able to flip said bit of said calibration memory cell.

26. The method of claim 25 further comprising:
   determining a minimum strength of said plurality of different weak write strengths that was able to flip said bit of said calibration memory cell; and
   selecting said minimum strength as said strength for said weak write to be utilized by said weak write test.

* * * * *